US012796410B2

(12) United States Patent
Chen et al.

(10) Patent No.: US 12,796,410 B2
(45) Date of Patent: Nov. 10, 2026

(54) PHOTOMASK STRUCTURE AND PATTERNING METHOD

(71) Applicant: Winbond Electronics Corp., Taichung City (TW)

(72) Inventors: Kao-Tun Chen, Taichung City (TW); Li-Chien Wang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 408 days.

(21) Appl. No.: 18/395,715

(22) Filed: Dec. 25, 2023

(65) Prior Publication Data

US 2024/0304445 A1 Sep. 12, 2024

(30) Foreign Application Priority Data

Mar. 6, 2023 (TW) ................................ 112108031

(51) Int. Cl.

| | |
|---|---|
| ***H10P 76/40*** | (2026.01) |
| ***G03F 1/36*** | (2012.01) |
| ***G03F 1/44*** | (2012.01) |
| ***H10P 50/28*** | (2026.01) |
| ***H10W 20/00*** | (2026.01) |

(52) U.S. Cl.
CPC ............ *H10P 76/4085* (2026.01); *G03F 1/36* (2013.01); *G03F 1/44* (2013.01); *H10P 50/283* (2026.01); *H10W 20/089* (2026.01)

(58) Field of Classification Search
CPC .............. H10P 76/4085; H10P 76/408; H10W 20/089; G03F 1/70; G03F 1/00–50
See application file for complete search history.

(56) References Cited

U.S. PATENT DOCUMENTS

| | | | | |
|---|---|---|---|---|
| 2004/0212796 A1* | 10/2004 | Adel | ......................... G03F 1/30 356/237.1 | |
| 2005/0079427 A1* | 4/2005 | Lee | ........................... G03F 1/30 257/E21.651 | |

FOREIGN PATENT DOCUMENTS

| | | | |
|---|---|---|---|
| CN | 111025845 A * | 4/2020 | .............. H10D 1/68 |
| JP | 6522277 | 5/2019 | |
| TW | 1660233 | 5/2019 | |

* cited by examiner

*Primary Examiner* — Britt Hanley
*Assistant Examiner* — Jason James Greaving
(74) *Attorney, Agent, or Firm* — JCIPRNET

(57) ABSTRACT

A photomask structure includes a plurality of first layout patterns, a plurality of second layout patterns, and a ring-shaped layout pattern. The first layout patterns and the second layout patterns are alternately arranged. Each of the first layout patterns has a first end and a second end. Each of the second layout patterns has a third end and a fourth end. The first end is adjacent to the third end. The second end is adjacent to the fourth end. The ring-shaped layout pattern surrounds the first layout patterns and the second layout patterns. The first end is connected to the ring-shaped layout pattern. The second end is not connected to the ring-shaped layout pattern. The third end is not connected to the ring-shaped layout pattern. The fourth end is connected to the ring-shaped layout pattern.

20 Claims, 9 Drawing Sheets

PHOTOMASK STRUCTURE AND PATTERNING METHOD

CROSS-REFERENCE TO RELATED APPLICATION

This application claims the priority benefit of Taiwan patent application serial no. 112108031, filed on Mar. 6, 2023. The entirety of the above-mentioned patent application is hereby incorporated by reference herein and made a part of this specification.

BACKGROUND

Technical Field

The disclosure relates to a photomask structure and a patterning method; more particularly, the disclosure relates to a photomask structure and a patterning method which may effectively reduce defects.

Description of Related Art

At present, in order to reduce a dimension of a semiconductor device, reducing a line width, reducing line spacing, and improving pattern transfer accuracy are issues that should be solved. A self-aligned double patterning (SADP) process is a means to solve the above issues. However, in the SADP process, after patterns of a spacer acting as a mask are transferred to a material layer to form a target structure, there are often spacer residues which may lead to defects.

SUMMARY

The disclosure provides a photomask structure and a patterning method capable of effectively reducing defects.

According to an embodiment of the disclosure, a photomask structure that includes a plurality of first layout patterns, a plurality of second layout patterns, and a ring-shaped layout pattern is provided. The first layout patterns and the second layout patterns are alternately arranged. Each of the first layout patterns has a first end and a second end. Each of the second layout patterns has a third end and a fourth end. The first end is adjacent to the third end, and the second end is adjacent to the fourth end. The ring-shaped layout pattern surrounds the first layout patterns and the second layout patterns. The first end is connected to the ring-shaped layout pattern, the second end is not connected to the ring-shaped layout pattern, the third end is not connected to the ring-shaped layout pattern, and the fourth end is connected to the ring-shaped layout pattern.

According to an embodiment of the disclosure, a patterning method includes following steps is provided. A substrate is provided. A material layer is formed on the substrate. A patterned photoresist layer is formed on the material layer by applying the aforesaid photomask structure, and the patterned photoresist layer has an opening. A spacer material layer is conformally formed on the patterned photoresist layer and in the opening. An etch-back process is performed on the spacer material layer, and a spacer is formed on a sidewall of the patterned photoresist layer. The patterned photoresist layer is removed. Patterns of the spacer are transferred to the material layer to form a target structure.

In view of the above, in the photomask structure and the patterning method provided in one or more embodiments of the disclosure, after the patterns of the spacer are transferred to the material layer in the patterning process carried out by applying the photomask structure having said layout design, spacer residues be prevented, and the defects may be effectively reduced. In addition, since the photomask structure and the patterning method provided in one or more embodiments of the disclosure may prevent the spacer residues, it is not necessary to perform any etching process to remove the spacer residues, thereby reducing the manufacturing costs and preventing a height of film layers from being reduced. Besides, the photomask structure and the patterning method provided in one or more embodiments of the disclosure may effectively improve a process window.

To make the above more comprehensible, several embodiments accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The embodiments are described in detail below with reference to the accompanying drawings but are not intended to limit the scope provided in the disclosure. For the sake of easy understanding, the same components in the following description will be denoted by the same reference numbers and signs.

Figure 1:
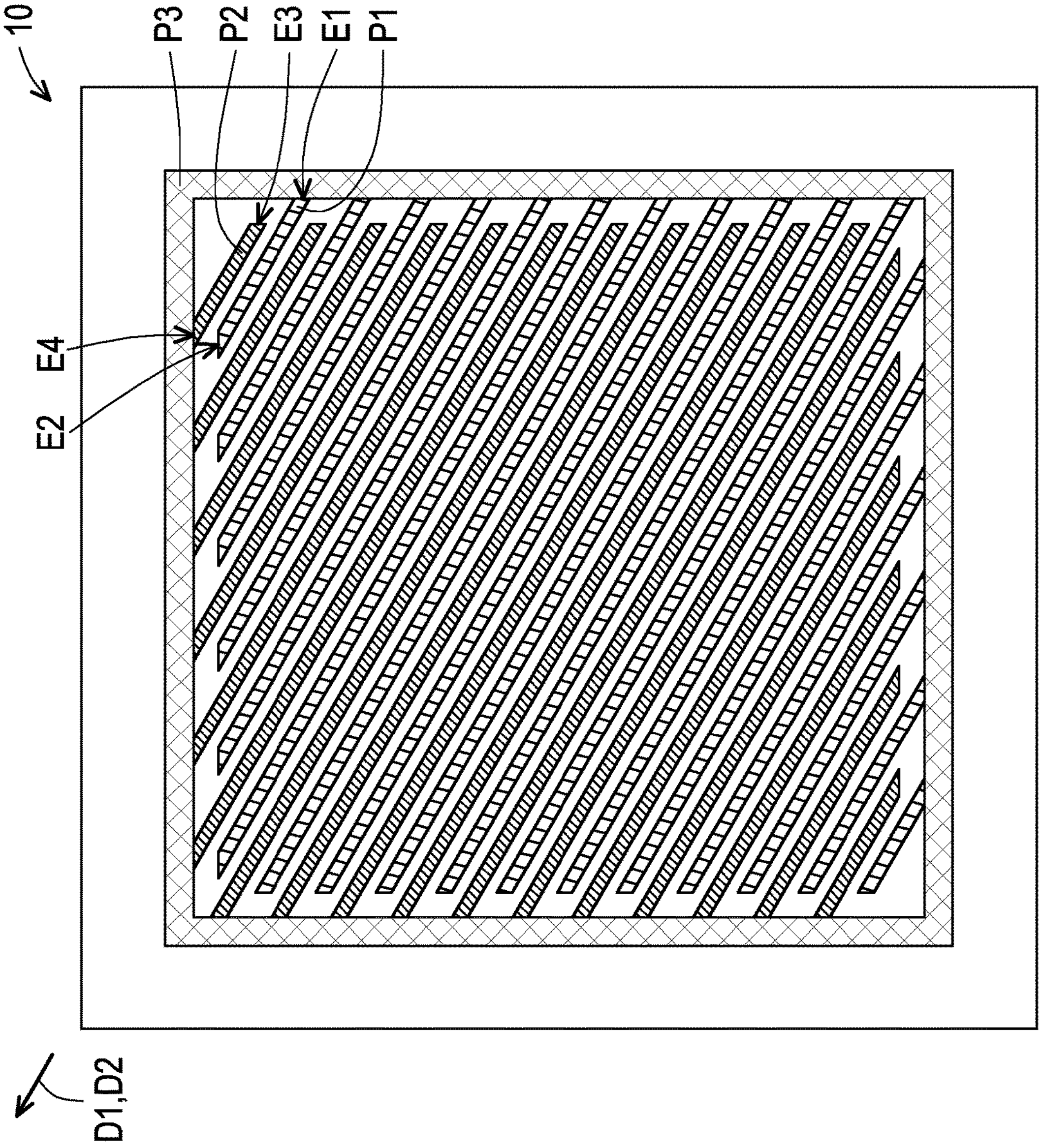
FIG. 1 is a top view illustrating a photomask structure according to some embodiments of the disclosure.

FIG. 1 is a top view illustrating a photomask structure according to some embodiments of the disclosure. FIG. 2A to FIG. 2E are cross-sectional views illustrating a patterning process according to some embodiments of the disclosure. FIG. 3A to FIG. 3E are cross-sectional views taken along a sectional line I-I' depicted in FIG. 2A to FIG. 2E. In this embodiment, some components in the cross-sectional views are omitted in the top view, so as to clearly explain location relationship among each component in the top view.

With reference to FIG. 1, a photomask structure 10 includes a plurality of layout patterns P1, a plurality of layout patterns P2, and a ring-shaped layout pattern P3. In some embodiments, the photomask structure 10 may be a binary photomask or a phase-shift photomask. In some embodiments, the layout patterns P1, the layout patterns P2, and the ring-shaped layout pattern P3 may be integrally formed. In some embodiments, the layout patterns P1, the layout patterns P2, and the ring-shaped layout pattern P3 may be light-transmitting patterns (e.g., a light-transmitting region) on the photomask structure 10. In some embodiments, the layout patterns P1, the layout patterns P2, and the ring-shaped layout pattern P3 may be light-transmitting patterns (e.g., a light-transmitting region) on the binary photomask, and an external region located outside the layout patterns P1, the layout patterns P2, and the ring-shaped layout pattern P3 may be opaque patterns (e.g., an opaque region) on the binary photomask. In some embodiments, the layout patterns P1, the layout patterns P2, and the ring-shaped layout pattern P3 may be light-transmitting patterns (e.g., a light-transmitting region) on the phase-shift photomask, and an external region located outside the layout patterns P1, the layout patterns P2, and the ring-shaped layout pattern P3 may be phase-shift patterns on the phase-shift photomask.

The layout patterns P1 and the layout patterns P2 are alternately arranged. Each of the layout patterns P1 has an end E1 and an end E2. Each of the layout patterns P2 has an end E3 and an end E4. The end E1 is adjacent to the end E3. The end E2 is adjacent to the end E4. The layout patterns P1 may be separated. The layout patterns P2 may be separated. The layout patterns P1 and the layout patterns P2 may be separated. An extension direction D1 of the layout patterns P1 may be parallel to an extension direction D2 of the layout patterns P2. In some embodiments, a shape of the layout patterns P1 and a shape of the layout patterns P2 may include a bar shape.

The ring-shaped layout pattern P3 surrounds the layout patterns P1 and the layout patterns P2. The end E1 is connected to the ring-shaped layout pattern P3. The end E2 is not connected to the ring-shaped layout pattern P3. The end E3 is not connected to the ring-shaped layout pattern P3. The end E4 is connected to the ring-shaped layout pattern P3.

Hereinafter, a patterning method performed by applying the above-mentioned photomask structure 10 is described with reference to FIG. 2A to FIG. 2E and FIG. 3A to FIG. 3E.

Figure 2A:
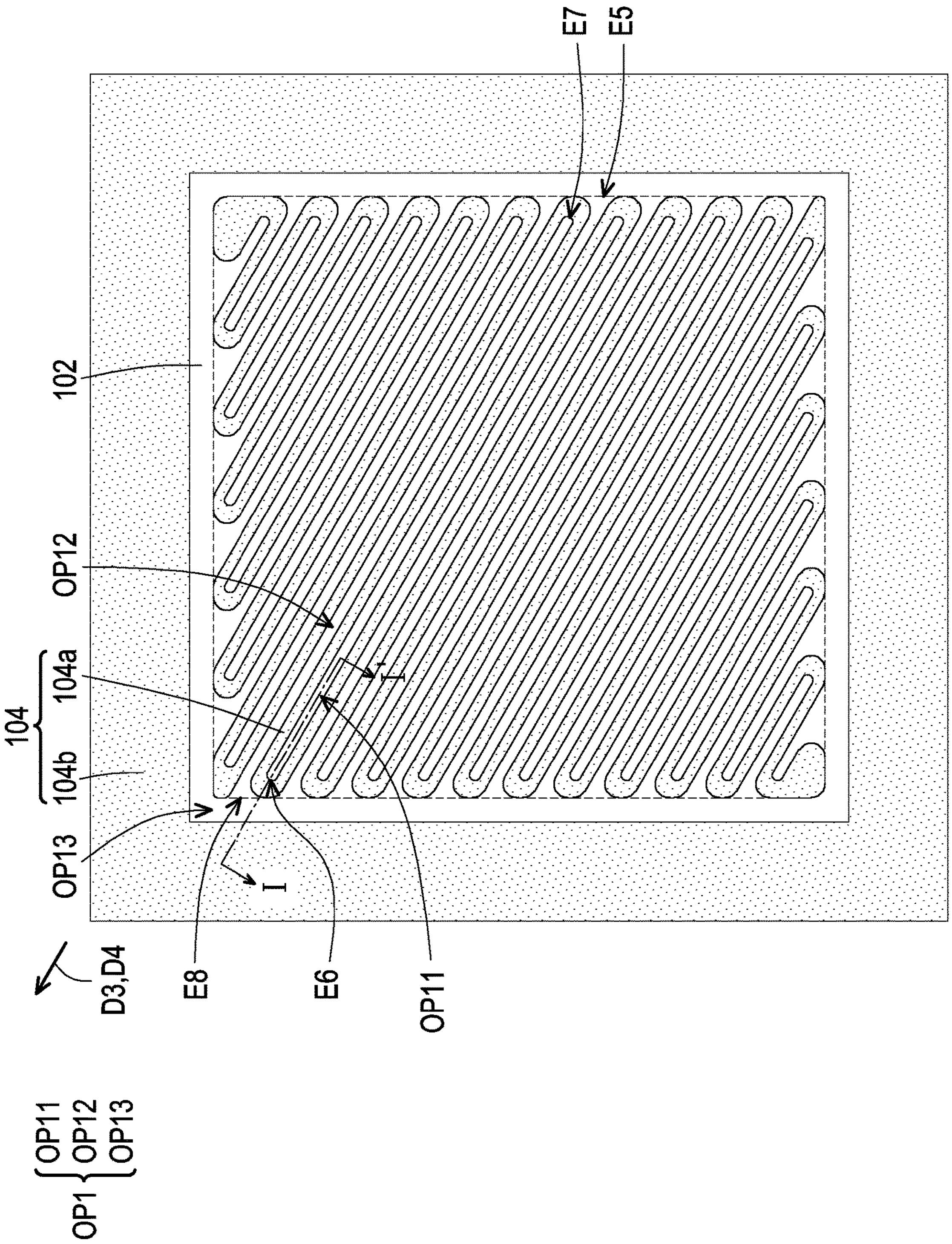
FIG. 2A to FIG. 2E are cross-sectional views illustrating a patterning process according to some embodiments of the disclosure.
Figure 3A:
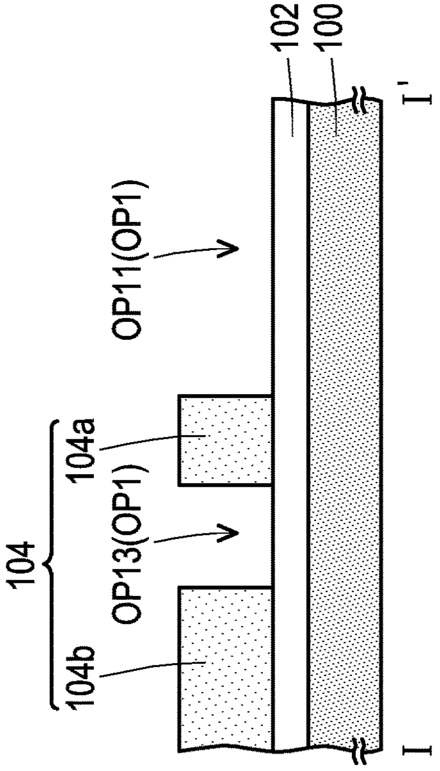
FIG. 3A to FIG. 3E are cross-sectional views taken along a sectional line I-I' depicted in FIG. 2A to FIG. 2E.

With reference to FIG. 2A and FIG. 3A, a substrate 100 is provided. In some embodiments, the substrate 100 may be a semiconductor substrate, e.g., a silicon substrate. In addition, although not shown in the drawings, there may be required components in or on the substrate 100 (e.g., a doped region, a dielectric layer, a conductive layer, a semiconductor layer, a transistor device, an interconnect structure, and so on), and descriptions thereof are omitted hereinafter.

Next, a material layer 102 is formed on the substrate 100. In this embodiment, the material layer 102 may be a film layer to be patterned. In some embodiments, a material of the material layer 102 is, for instance, a dielectric material, a conductive material, or a semiconductor material. In this embodiment, the material of the material layer 10 is, for instance, nitride (e.g., silicon nitride), which should however not be construed as a limitation in the disclosure. In some embodiments, a method of forming the material layer 102 includes, for instance, a chemical vapor deposition (CVD) method or a physical vapor deposition (PVD) method.

A patterned photoresist layer 104 is formed on the material layer 102 by applying the aforesaid photomask structure 10. In some embodiments, the patterned photoresist layer 104 may serve as a core pattern in a SADP process. The patterned photoresist layer 104 has an opening OP1. In some embodiments, the opening OP1 may expose a portion of the material layer 102. The opening OP1 may include a plurality of opening patterns OP11, a plurality of opening patterns OP12, and a ring-shaped opening pattern OP13. The opening patterns OP11 and the opening patterns OP12 may be arranged alternately. Each of the opening patterns OP11 may have an end E5 and an end E6. Each of the opening patterns OP12 may have an end E7 and an end E8. The end E5 is adjacent to the end E7. The end E6 is adjacent to the end E8. The opening patterns OP11 are separated. The opening patterns OP12 are separated. The opening patterns OP11 and the opening patterns OP12 are separated. An extension direction D3 of the opening patterns OP11 may be parallel to an extension direction D4 of the opening patterns OP12. In some embodiments, a shape of the opening patterns OP11 and a shape of the opening patterns OP12 may include a bar shape.

The ring-shaped opening pattern OP13 may surround the opening patterns OP11 and the opening patterns OP12. The end E5 is connected to the ring-shaped opening pattern OP13. The end E6 is not connected to the ring-shaped opening pattern OP13. The end E7 is not connected to the ring-shaped opening pattern OP13. The end E8 is connected to the ring-shaped opening pattern OP13.

The patterned photoresist layer 104 may include a bent portion **104*a* and a ring-shaped portion 104*b*. The ring-shaped portion 104*b* may surround the bent portion 104*a*. The ring-shaped portion 104*b* may surround the opening OP1. The ring-shaped opening pattern OP13 may be located between the ring-shaped portion 104*b* and the bent portion 104*a*. The ring-shaped opening pattern OP13 may surround the bent portion 104*a***.

Figure 2B:
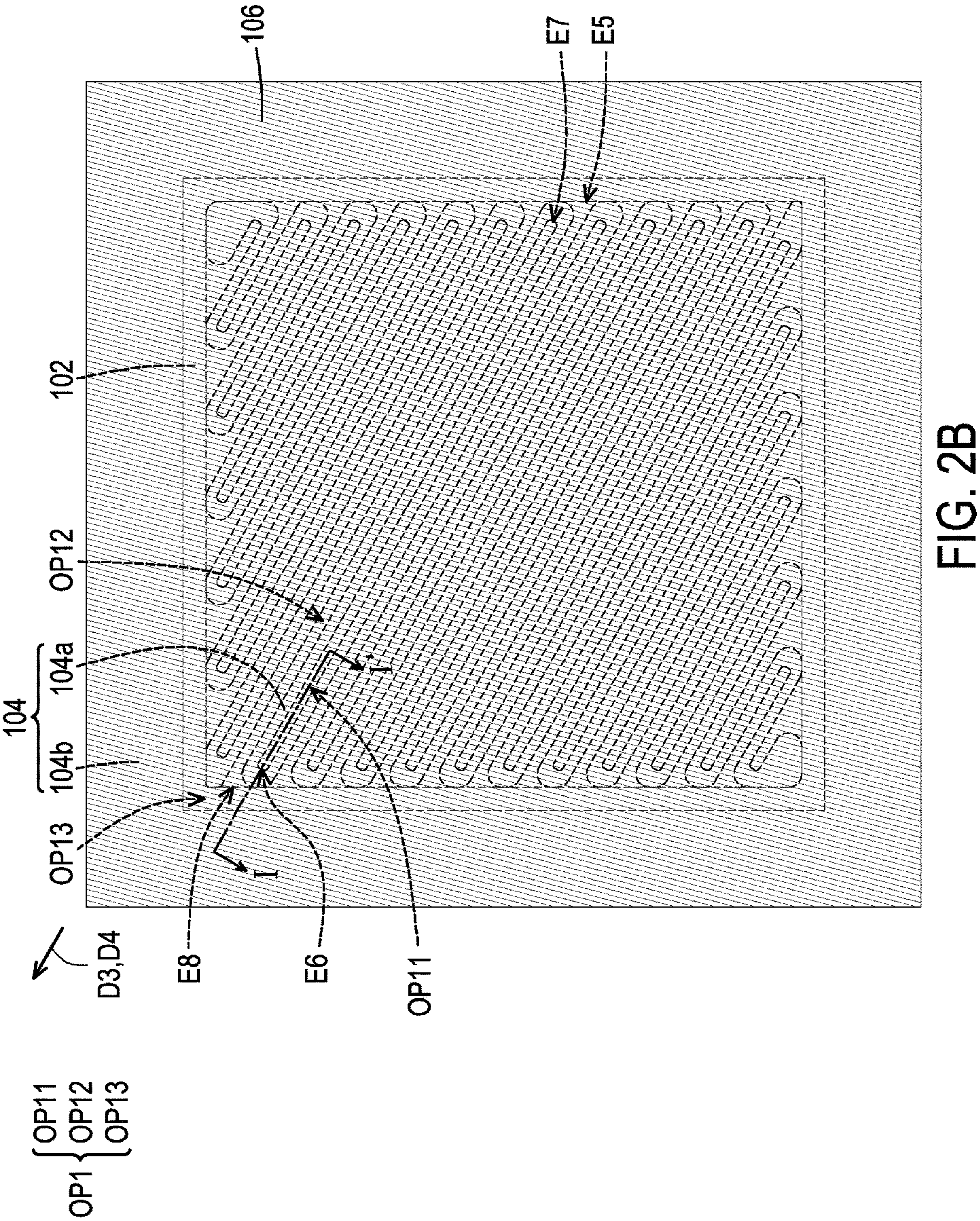
Figure 3B:
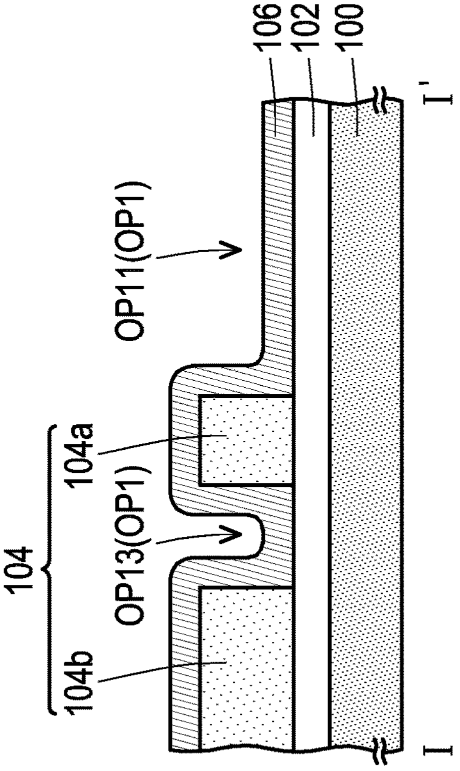

With reference to FIG. 2B and FIG. 3B, a spacer material layer 106 is conformally formed on the patterned photoresist layer 104 and in the opening OP1. The spacer material layer 106 may be further formed on the material layer 102 exposed by the opening OP1. In some embodiments, since the patterned photoresist layer 104 formed by applying the above-mentioned photomask structure 10 may create an environment proper for performing a deposition process, an issue that a deposition thickness of the spacer material layer 106 is partially overly large may be prevented. In some embodiments, a material of the spacer material layer 106 is, for instance, a dielectric material. In this embodiment, the material of the spacer material layer 106 is, for instance, oxide (e.g., silicon oxide), which should however not be construed as a limitation in the disclosure. In some embodiments, a method of forming the spacer material layer 106 is, for instance, a CVD method.

Figure 2C:
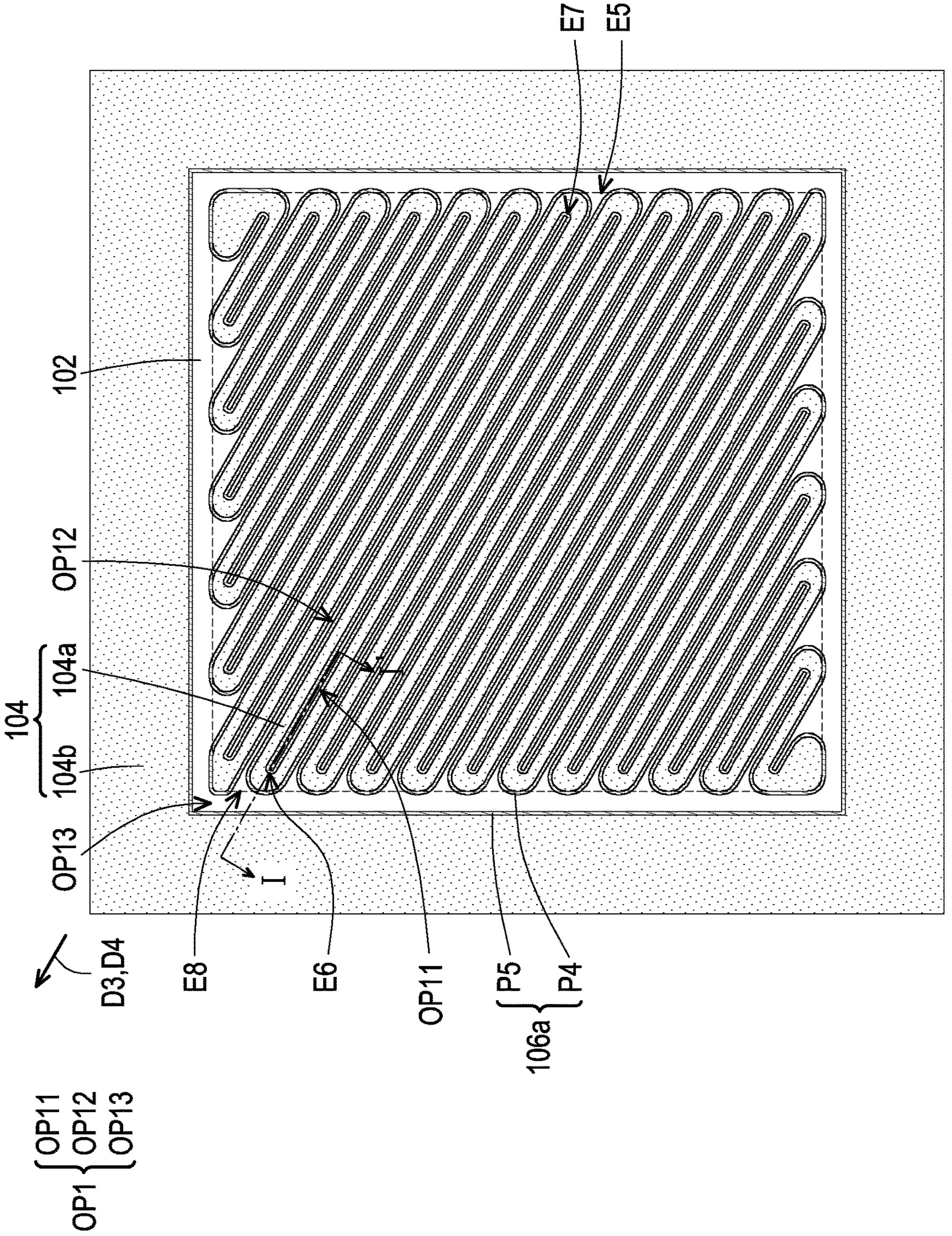
Figure 3C:
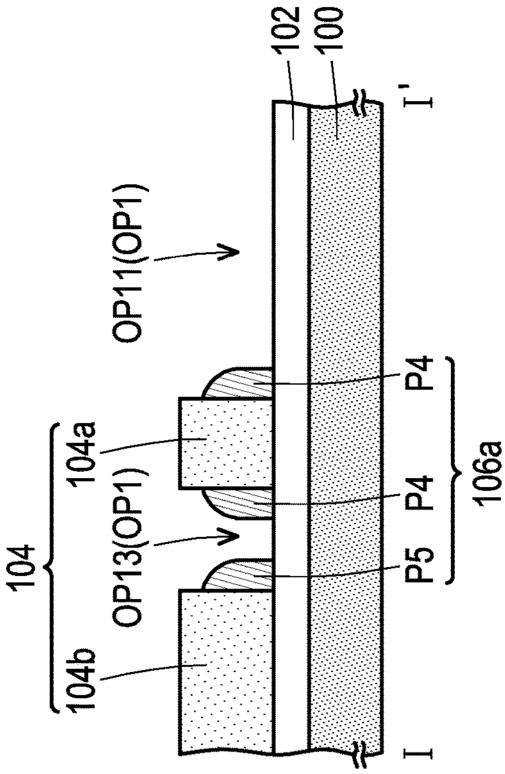

With reference to FIG. 2C and FIG. 3C, an etch-back process is performed on the spacer material layer 106, and a spacer **106*a* is formed on a sidewall of the patterned photoresist layer 104. In some embodiments, the spacer 106*a* may include a spacer pattern P4 and a spacer pattern P5. The spacer pattern P4 and the spacer pattern P5 may be separated from each other. The spacer pattern P5 may surround the spacer pattern P4. The spacer pattern P4 may be located on a sidewall of the bent portion 104*a*. The spacer pattern P5 may be located on a sidewall of the ring-shaped portion 104*b***. In some embodiments, the etch-back process is, for instance, a dry etching process.

Figure 2D:
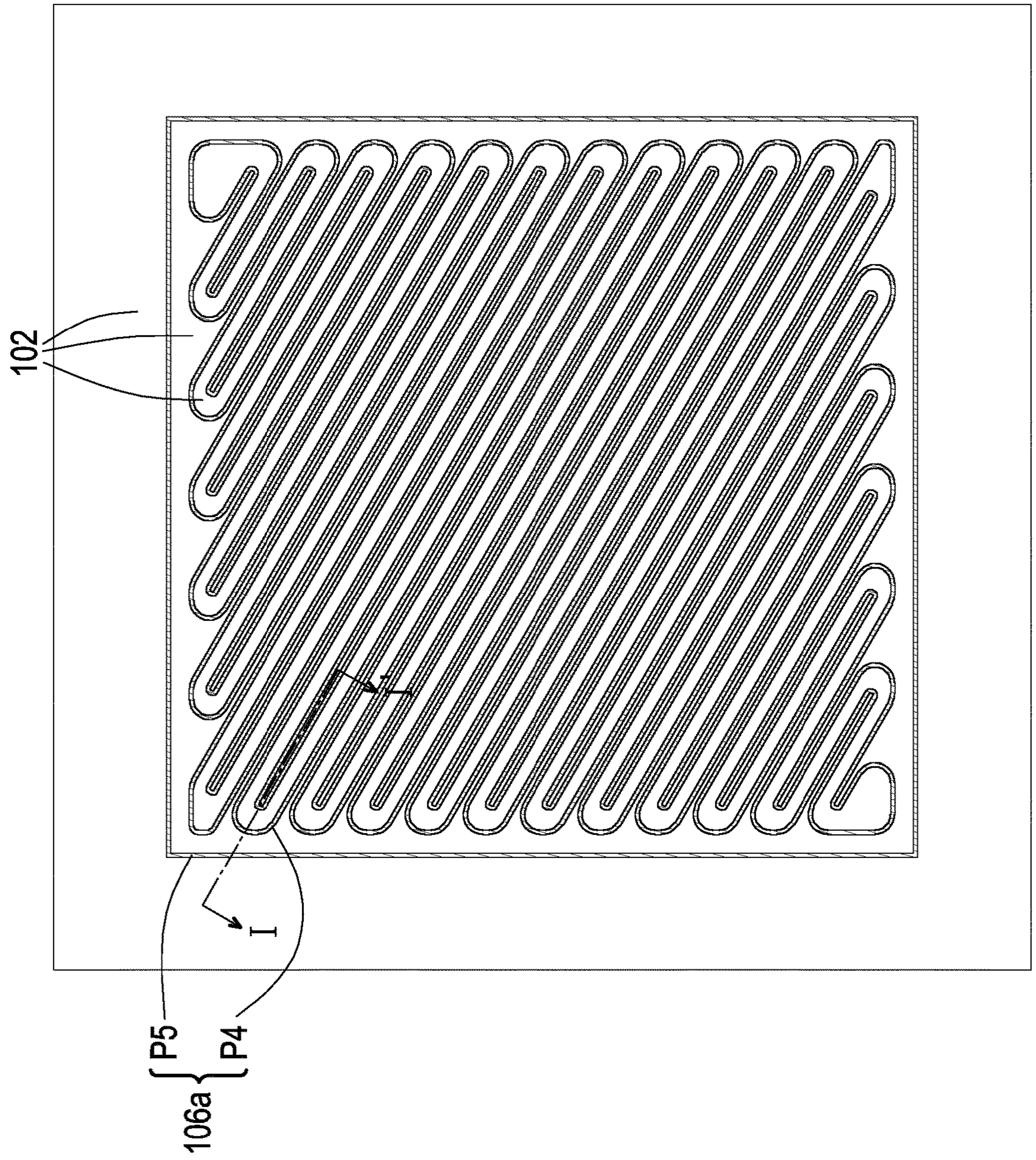
Figure 3D:
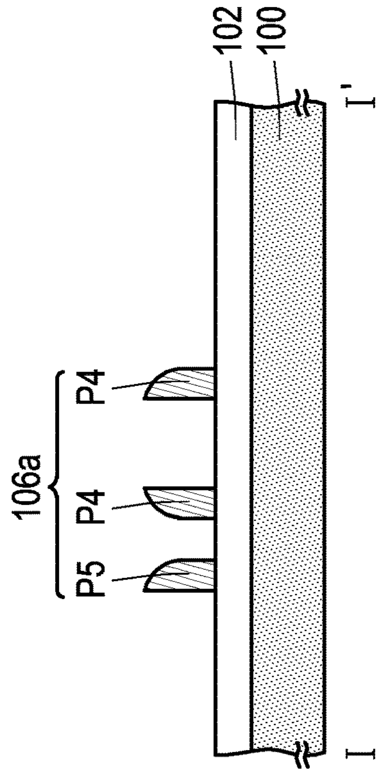

With reference to FIG. 2D and FIG. 3D, the patterned photoresist layer 104 is removed. In some embodiments, a method of removing the patterned photoresist layer 104 is, for instance, a dry stripping method or a wet stripping method.

Figure 2E:
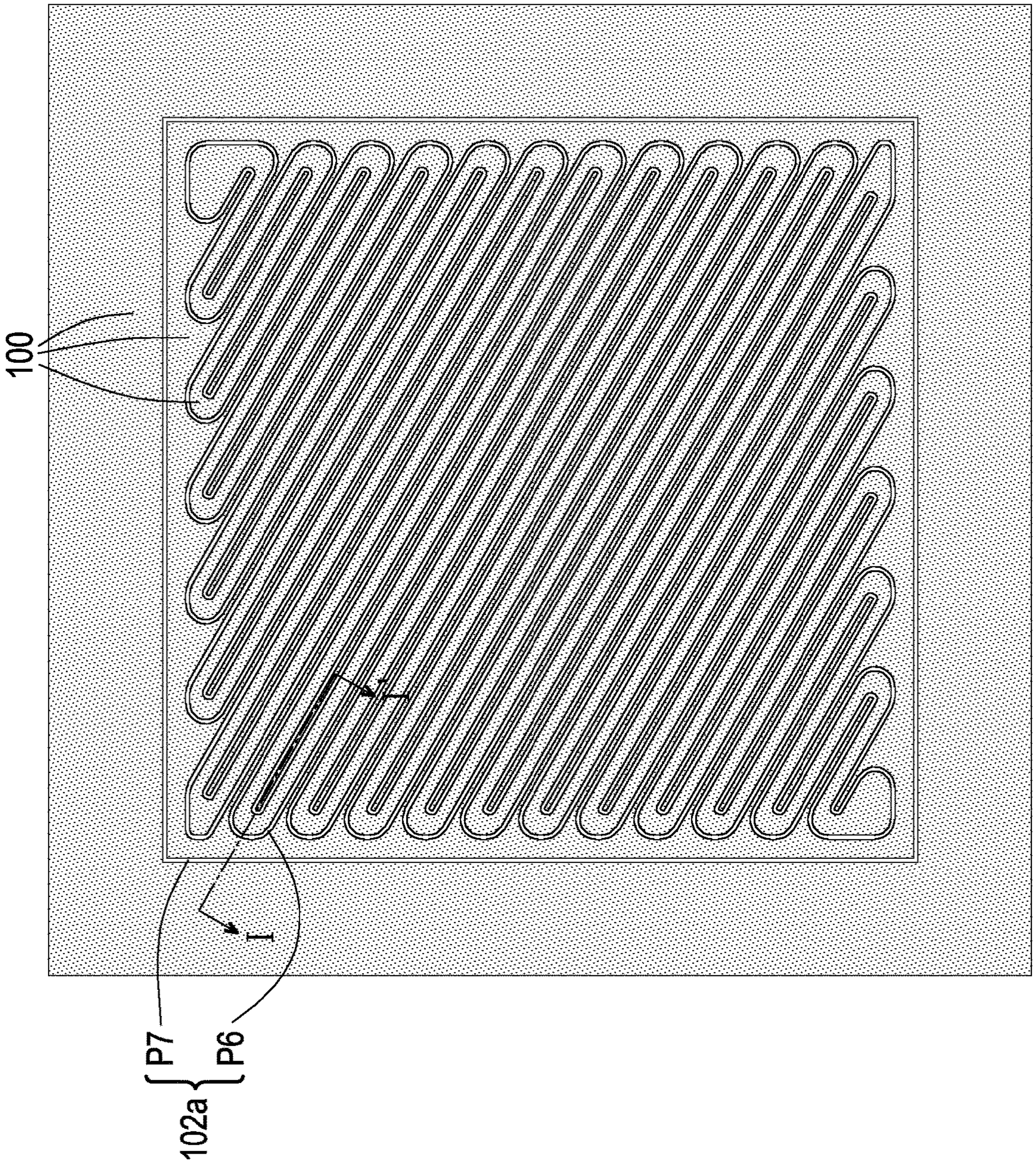
Figure 3E:
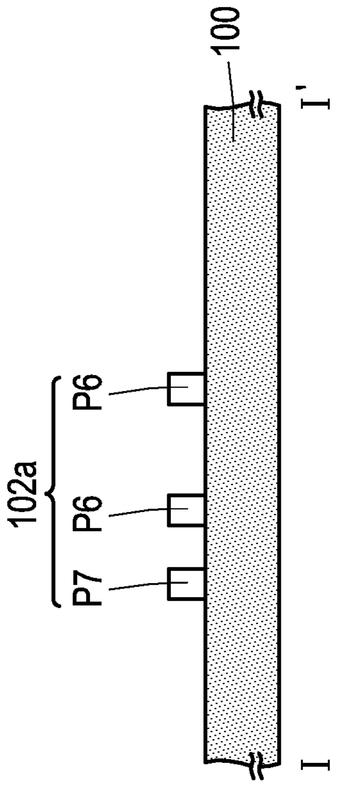

With reference to FIG. 2E and FIG. 3E, patterns of the spacer **106*a* are transferred to the material layer 102 to form a target structure 102*a*. Patterns of the target structure 102*a* may correspond to the patterns of the spacer 106*a*. In some embodiments, the target structure 102*a* may be a patterned hard mask layer, a conductive wire, or another component. In this embodiment, the target structure 102*a* may be the patterned hard mask layer, which should however not be construed as a limitation in the disclosure. In some embodiments, the target structure 102*a* may include a target pattern P6 and a target pattern P7. The target pattern P6 and the target pattern P7 may be separated. The target pattern P7 may surround the target pattern P6. In some embodiments, a method of transferring the patterns of the spacer 106*a* to the material layer 102 may include removing a portion of the material layer 102 by applying the spacer 106***a* as a mask. The method of removing the portion of the material layer 102 is, for instance, a dry etching method. In some embodiments, in the dry etching process used to remove the portion material layer 102, the spacer 106*a* can be removed at the same time.

To sum up, in the photomask structure 10 and the patterning method provided in one or more embodiments of the disclosure, after the patterns of the spacer 106*a* are transferred to the material layer 102 in the patterning process carried out by applying the photomask structure 10 having the above layout design, residues of the spacer 106*a* may be prevented, thereby effectively reducing defects. In addition, since the above photomask structure 10 and the above patterning method may prevent the residues of the spacer 106*a*, it is not necessary to perform any etching process to remove the residues of the spacer 106*a*, thereby reducing the manufacturing costs and preventing the height of the film layers from being reduced. Besides, the above photomask structure 10 and the above patterning method may effectively improve the process window.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photomask structure, comprising:

a plurality of first layout patterns and a plurality of second layout patterns, wherein the first layout patterns and the second layout patterns are alternately arranged, each of the first layout patterns has a first end and a second end, each of the second layout patterns has a third end and a fourth end, the first end is adjacent to the third end, and the second end is adjacent to the fourth end; and a ring-shaped layout pattern, surrounding the first layout patterns and the second layout patterns, wherein the first end is connected to the ring-shaped layout pattern, the second end is not connected to the ring-shaped layout pattern, the third end is not connected to the ring-shaped layout pattern, and the fourth end is connected to the ring-shaped layout pattern.

2. The photomask structure according to claim 1, wherein the first layout patterns are separated.

3. The photomask structure according to claim 1, wherein the second layout patterns are separated.

4. The photomask structure according to claim 1, wherein the first layout patterns and the second layout patterns are separated.

5. The photomask structure according to claim 1, wherein the first layout patterns, the second layout patterns, and the ring-shaped layout pattern comprise a light-transmitting pattern.

6. The photomask structure according to claim 1, wherein an extension direction of the first layout patterns is parallel to an extension direction of the second layout patterns.

7. The photomask structure according to claim 1, wherein a shape of the first layout patterns and a shape of the second layout patterns comprise a bar shape.

8. The photomask structure according to claim 1, wherein the photomask structure comprises a binary photomask or a phase-shift photomask.

9. A patterning method, comprising:

providing a substrate;

forming a material layer on the substrate;

forming a patterned photoresist layer on the material layer by applying the photomask structure according to claim 1, wherein the patterned photoresist layer has an opening;

conformally forming a spacer material layer on the patterned photoresist layer and in the opening;

performing an etch-back process on the spacer material layer, and forming a spacer on a sidewall of the patterned photoresist layer;

removing the patterned photoresist layer; and transferring patterns of the spacer to the material layer to form a target structure.

10. The patterning method according to claim 9, wherein the opening comprises:

a plurality of first opening patterns and a plurality of second opening patterns, where the first opening patterns and the second opening patterns are arranged alternately, each of the first opening patterns has a fifth end and a sixth end, each of the second opening patterns has a seventh end and an eighth end, the fifth end is adjacent to the seventh end, and the sixth end is adjacent to the eighth end; and a ring-shaped opening pattern, surrounding the first opening patterns and the second opening patterns, wherein the fifth end is connected to the ring-shaped opening pattern, the sixth end is not connected to the ring-shaped opening pattern, the seventh end is not connected to the ring-shaped opening pattern, and the eighth end is connected to the ring-shaped opening pattern.

11. The patterning method according to claim 10, wherein the patterned photoresist layer comprises:

a bent portion;

a ring-shaped portion, surrounding the bent portion.

12. The patterning method according to claim 11, wherein the ring-shaped portion surrounds the opening.

13. The patterning method according to claim 11, wherein the ring-shaped opening pattern is located between the ring-shaped portion and the bent portion.

14. The patterning method according to claim 11, wherein the ring-shaped opening pattern surrounds the bent portion.

15. The patterning method according to claim 10, wherein an extension direction of the first opening patterns is parallel to an extension direction of the second opening patterns.

16. The patterning method according to claim 10, wherein a shape of the first opening patterns and a shape of the second opening patterns comprise a bar shape.

17. The patterning method according to claim 9, wherein a material of the material layer comprises a dielectric material, a conductive material, or a semiconductor material.

18. The patterning method according to claim 9, wherein a method of transferring the patterns of the spacer to the material layer comprises:

removing a portion of the material layer by applying the spacer as a mask.

19. The patterning method according to claim 9, wherein the spacer comprises a first spacer pattern and a second spacer pattern, the first spacer pattern and the second spacer pattern are separated from each other, and the second spacer pattern surrounds the first spacer pattern.

20. The patterning method according to claim 9, wherein the target structure comprises a first target pattern and a second target pattern, the first target pattern and the second target pattern are separated from each other, and the second target pattern surrounds the first target pattern.

* * * * *